US00RE36621E

United States Patent [19]

Nakaoka

[11] E Patent Number: Re. 36,621

[45] Reissued Date of Patent: Mar. 21, 2000

[54] SEMICONDUCTOR MEMORY DEVICE

[75] Inventor: Yuji Nakaoka, Tokyo, Japan

[73] Assignee: NEC Corporation, Tokyo, Japan

[21] Appl. No.: 09/040,294

[22] Filed: Mar. 18, 1998

Related U.S. Patent Documents

Reissue of:

[64] Patent No.: 5,500,820
Issued: Mar. 19, 1996
Appl. No.: 08/129,362
Filed: Sep. 30, 1993

[30] Foreign Application Priority Data

Sep. 30, 1992 [JP] Japan ..... 4-262382

[51] Int. Cl.[7] ..... G11C 2/00

[52] U.S. Cl. ..... 365/189.01; 365/189.05; 365/190; 365/196; 365/207

[58] Field of Search ..... 365/189.11, 190, 365/189.01, 189.05, 196, 202, 207, 230.06

[56] References Cited

U.S. PATENT DOCUMENTS

| | | | |
|---|---|---|---|
| 4,300,213 | 11/1981 | Tanimura et al. | 365/190 |
| 4,618,785 | 10/1986 | van Tran | 365/190 |
| 4,760,561 | 7/1988 | Yamamoto et al. | 365/190 |
| 4,791,613 | 12/1988 | Hardee | 365/190 |
| 4,866,674 | 9/1989 | Tran | 365/189.11 |
| 4,931,998 | 6/1990 | Ootani et al. | 365/230.01 |
| 4,939,691 | 7/1990 | Mizukami et al. | 365/189.01 |
| 4,954,992 | 9/1990 | Kumanoya et al. | 365/207 |
| 4,961,168 | 10/1990 | Tran | 365/189.11 |
| 5,010,521 | 4/1991 | Matsui | 365/189.01 |
| 5,043,943 | 8/1991 | Crisp et al. | 365/189.01 |
| 5,084,838 | 9/1991 | Kajimoto | 365/189.01 |
| 5,115,411 | 5/1992 | Kass et al. | 365/189.01 |
| 5,268,863 | 12/1993 | Bader et al. | 365/189.01 |
| 5,287,326 | 2/1994 | Hirata | 365/189.06 |
| 5,295,099 | 3/1994 | Kagami | 365/189.06 |
| 5,436,864 | 7/1995 | Koh et al. | 365/189.11 |

FOREIGN PATENT DOCUMENTS 0257912 3/1988 European Pat. Off. .

*Primary Examiner*—Tan T. Nguyen
*Attorney, Agent, or Firm*—Sughrue, Mion, Zinn, Macpeak & Seas, PLLC

[57] ABSTRACT

The semiconductor memory device comprises a memory array (9) and a data bus line (1) for transferring read and write data between the memory array and an input buffer (IB) and an output buffer (OB) and also transferring an information indicating read or write mode operation. The data bus line transfers the read data as a complement signal having a predetermined amplitude which is smaller than a potential difference between high and low level power source lines (7 and 8, respectively). The predetermined amplitude is defined by a first and a second impedance (2 and 3, respectively) connected between the data bus line and a first and a second power source line (7 and 8), respectively, The first impedance (2) is associated with a first end of the data bus line in the input-output buffer area and the second impedance (3) is associated with a second end of the data bus line in the inner circuit area of the device. The write data is transferred via the data bus line (1) as a complement signal having a larger amplitude than that of read data. The memory array accepts the signal on the data bus line as a write data signal according to its amplitude. The memory array (9) is equipped with a write control gate for detecting the amplitude of the complement signal on the data bus lane (1).

23 Claims, 11 Drawing Sheets

FIG. 2
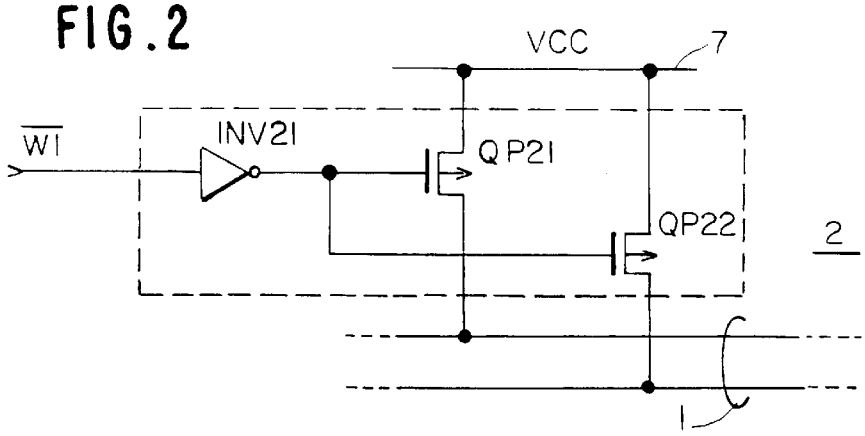
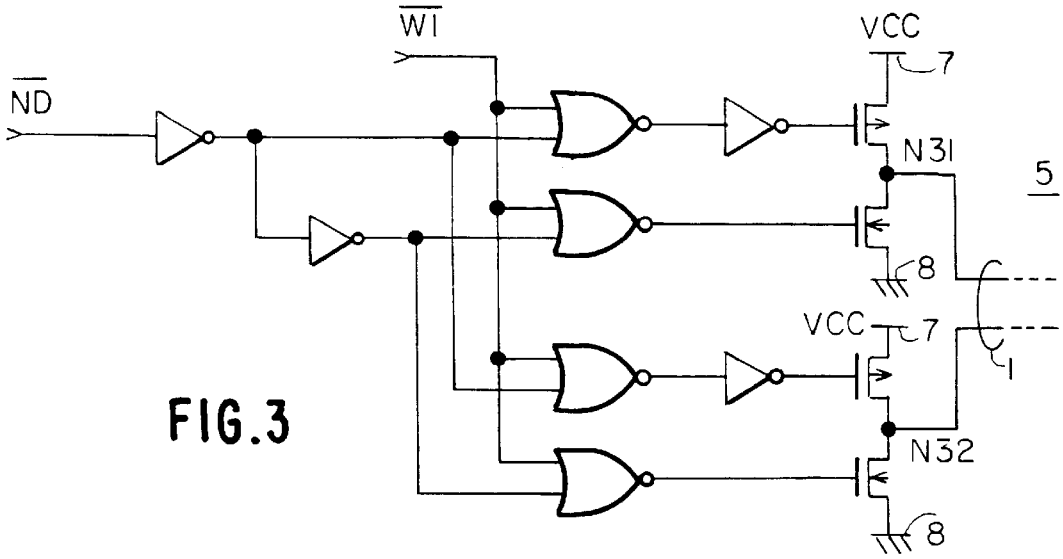
FIG. 3
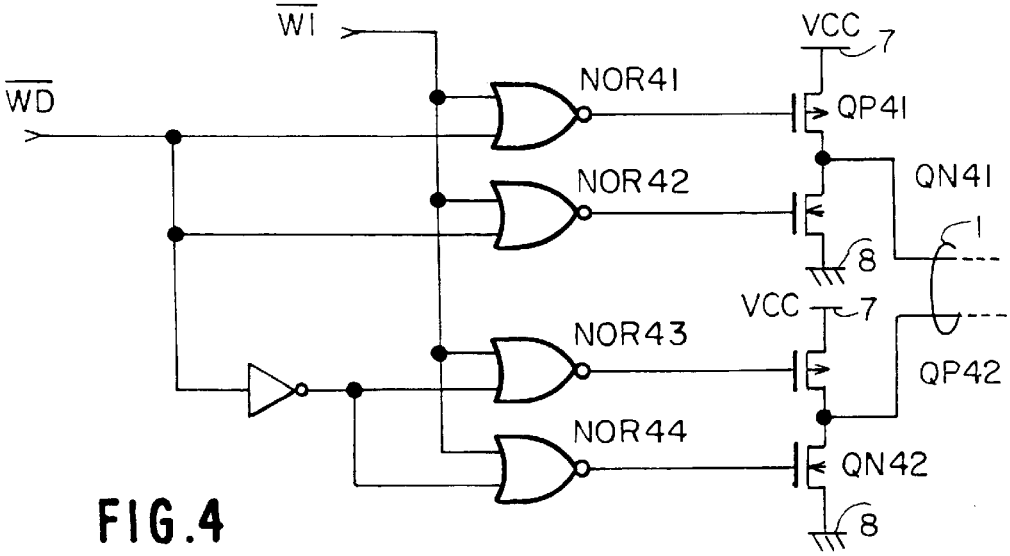
FIG. 4

FIG. 12
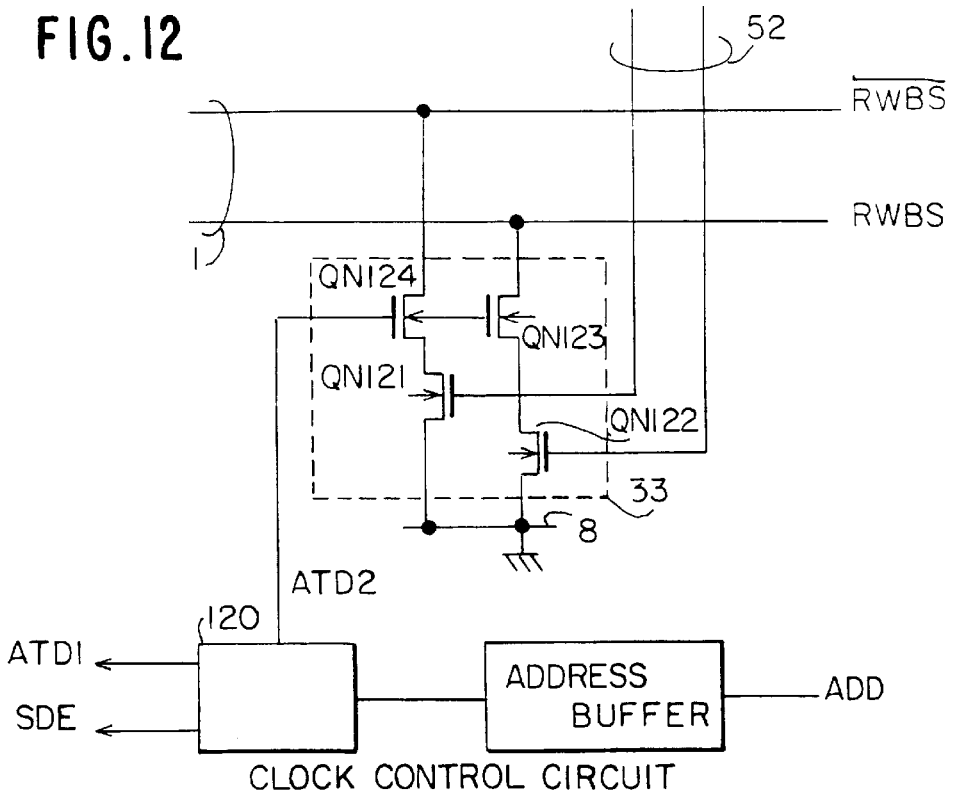
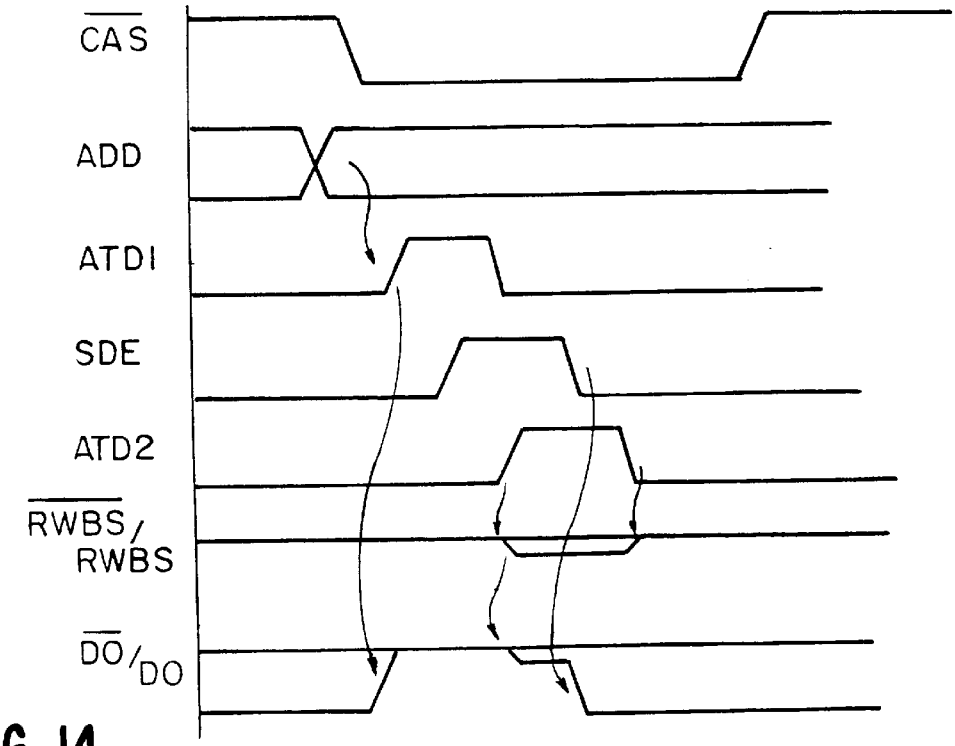
FIG. 14

SEMICONDUCTOR MEMORY DEVICE

Matter enclosed in heavy brackets [ ] appears in the original patent but forms no part of this reissue specification; matter printed in italics indicates the additions made by reissue.

BACKGROUND OF THE INVENTION

The present invention relates to a memory device and, more particularly, to a dynamic random access memory operating in high speed and with small current consumption.

A semiconductor memory device is, in general, equipped with a common data bus line for transferring data read out of a selected memory cell (i.e., read data) and data to be written into a selected memory cell (i.e., write data) between an input/output buffer portion and an inner circuit portion including a memory array, a read amplifier and a write amplifier. In this circuit configuration, the inner circuit requires control signals which indicate a read mode or a write mode operation.

While the data bus line is coupled in common to the write amplifier and the read amplifier, a write-in line for transferring write data from the write amplifier to the memory array and a read-out line for transferring read data from the memory array to the read amplifier are formed independently. Since the write-in line and the read-out line are provided independently of each other, it is possible to send column selection signals more quickly and operation speed is improved. On the other hand, this type of device needs control signals for activating the write amplifier and the read amplifier independently of each other, so that a region for forming the control signal lines becomes large. Moreover, the read amplifier is required to drive the data bus line sufficiently, so that the operation speed is lowered. This will be explained in more detail with reference to FIGS. 15 and 16.

FIG. 15 shows a circuit diagram of a. prior art semiconductor memory device. This device includes a memory array 108, a data bus line pair 110 including true and complementary lines RWBS, and $\overline{\text{RWBS}}$, an input buffer 102, an output buffer 103, a write buffer 109, a write amplifier circuit 104, a read amplifier 105, and a write mode control circuit 101. During a read mode, the read amplifier 105 is actuated by a mode signal $\overline{\text{W1}}$ and drives the data lines $\overline{\text{RWBS}}$, RWBS of the data bus line 110 to Send true and complementary read data signals having an amplitude as large as the potential difference between high level and low level power source lines. Before a write mode operation, the read amplifier 105 has to be deactuated by the signal W1 to prevent a collision of read data and write data on the data bus line 110. During a write mode, the write buffer 109 is activated by the low level of the signal $\overline{\text{W1}}$ to drive the data bus line 110 according to write data from the input buffer 102, and the write amplifier 104 is actuated by a control signal W2 to transfer the write data to the memory array 108.

FIG. 16 shows a timing chart of the read and write mode operations of the prior art device. The operation in the chart starts with the state in which an row address strobe signal $\overline{\text{RAS}}$ (not shown) has moved from a high level to a low level to fetch, a row address signal so that a potential of selected word line W became high by a row decoder 108-1 and a sense amplifier 106 amplifies a potential difference between a pair of bit lines B and $\overline{\text{B}}$ in accordance with data stored in a selected memory cell 107.

First, the read mode operation will be described. In response to a column address signal at a time when an external column address strobe signal $\overline{\text{CAS}}$ (not shown) is at "High", a column selection signal YSW goes from "Low" to "High" by a column decoder 108-2. As the column selection signal YSW goes to "High" the potential difference between the bit lines $\overline{\text{D}}$ and D is transferred to a pair of read-out lines RO and $\overline{\text{RO}}$ and further to the read amplifier 105 via N-channel transistors $Q_{N407}$ to $Q_{N410}$. The read amplifier 105 amplifies the potential difference thus transferred and outputs true and complementary signals representative of the read data onto the data line pair 110, these signals having an amplitude as large as the potential difference between a high and a low level power source line. In the read mode, when the external signal $\overline{\text{CAS}}$ is changed to the active low level, a write-enable signal $\overline{\text{WE}}$ is held at the high level. Accordingly, the mode control circuit 101 produces an output-enable signal OE with an active high level, so that the output buffer 103 is activated to generate an output data signal $D_{out}$ in response to the signals on the data bus line pair 110.

Next, the write mode operation will be described in this mode, the write enable signal $\overline{\text{WE}}$ changes to the low level in synchronism with the change in the strobe signal CAS to the low level, as show in FIG. 16. Thus, the input buffer 102 is activated according to the "High" level of the signal WO to latch input data $D_{in}$ and output it to the write buffer 109 as write data $\overline{\text{WD}}$.

Subsequently, the control signal $\overline{\text{W1}}$ goes from "High" to "Low" to put the read amplifier 105 in a deactuated state in which the output terminals of the read amplifier 105 are in high impedance state. At the same time, the write buffer 109 is actuated to drive the data bus line pair 110 in accordance with the write data $\overline{\text{WD}}$ from the input buffer 102. The control signal W2 is then changed to the high level to activate the write amplifier circuit 44 which thereby generates a high level control signal WSW and supplies a pair of write-in lines WI and $\overline{\text{W1}}$ with true and complementary signals indicative of the write data. The high level control signal WSW turns N-channel transistors $Q_{N403}$ and $Q_{N404}$ ON, so that the true and complementary signals of the write data are transferred to the bit line pair D/D. The data is thus written in the selected memory cell 107

The control signal $\overline{\text{W1}}$ is a one-shot signal having a "Low" state only during the write mode and goes to "High" when or Just before the write data is safely transferred to a memory cell 107. Subsequently, the control signal W2 and WSW goes to "Low" and the write mode operation is finished.

As apparent from the above description, since the read amplifier 105 is required to drive the data bus line pair 101 with the true and complementary read data signals having an amplitude as large as the difference between high and low level power source lines, so that the current consumption becomes large and data read-out speed is decreased. In addition, the read amplifier 105 needs a large capability for driving the data bus line pair 110 and occupies a large area. Moreover, considering a multibit construction such as a 4-bit or 8-bit, a plurality of read amplifiers and write amplifiers are provided, and therefore, the control signal lines for W1 and W2 are required to be prolonged. The occupying area for forming the control signal lines is thereby made large, and stray capacitance is also increased. Furthermore, the write amplifier 104 is activated alter deactivating the read amplifier 105 in the data write mode, and for this reason the data write operation speed is also lowered.

SUMMARY OF THE INVENTION

Therefore, a major object of the invention is to provide a semiconductor memory device having a small current consumption and decreased number of control signal lines in order to achieve a high speed operation and have a high density of integration.

A semiconductor memory device according to the present invention is characterized in that a read data signal transferred through a data bus line has an amplitude smaller than the amplitude of a write data signal transferred through the data bus line. The amplitude of the read data signal is defined by a first and a second impedance means connected between the data bus line and a first and a second power source line respectively. The first impedance means is associated with a first end of the data bus line in the input-output buffer region and the second impedance means is associated with a second end of the data bus line in the inner circuit region of the device. The write data is transferred via the data bus line as a complementary signal having a larger amplitude than that of read data. The memory array accepts the signal on the data bus line as a write data signal according to its amplitude. The memory array is equipped with a write control gate for detecting the amplitude of the complementary signal on the data bus line.

BRIEF DESCRIPTION OF THE DRAWINGS

The invention is further described with reference to the enclosed drawings, in which:

FIG. 2 is a circuit configuration of the impedance means;

FIG. 3 is a circuit configuration of the write buffer;

FIG. 4 is a further embodiment of the circuit design of the impedance means and the write buffers

FIG. 12 shows the impedance means according to a third embodiment;

FIG. 14 is a timing chart describing an operation of the device of the third embodiment;

DETAILED DESCRIPTION OF THE PREFERRED EMBODIMENTS

Figure 1:
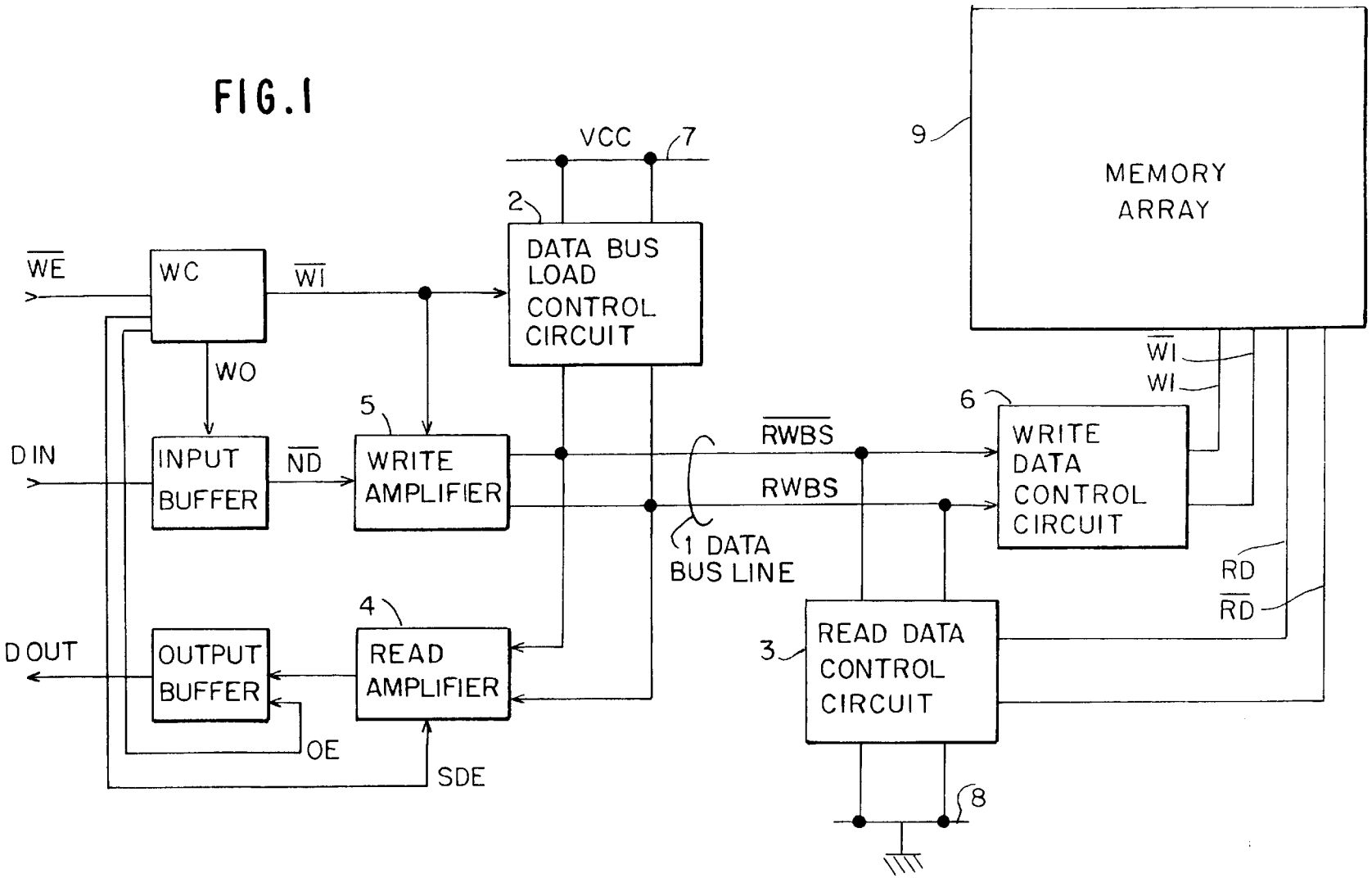
FIG. 1 is a block diagram describing a memory device according to a first embodiment of the invention.

Referring to FIG. 1 of the drawings, a semiconductor memory device according to the first embodiment of the invention comprises a memory array 9 and a data bus line pair 1 having true and complementary data lines $\overline{\text{RWBS}}$ and RWBS. One end of the data bus line 1 is connected to a write data control gate 6 which is in turn connected to the memory array 9 via a pair of write-in lines WI and $\overline{\text{WI}}$, and also connected to a read data control circuit 3 which is in turn connected to the .memory array 9 via a pair of read-out lines RO and $\overline{\text{RO}}$ and associated with a ground line 8. Another end of the data bus line 1 is connected to a write amplifier 5, a read amplifier 4 and a data bus load control circuit 2 which is associated with a power source (Vcc) line 7. The write amplifier 5 outputs drives the data line pair 1 with true and complementary signals indicative of write data having an amplitude between the potential levels of the power source lines 7 and 8 during a write mode. At this time, the circuit 2 is deactivated. The write amplifier 5 maintains its output terminals at a high impedance state during a read mode. The write data control gate 6 responds the amplitude of the true and complementary write data signals on the data bus line 1 and transfers the data signal to the memory array 9, as write data during a write mode. In a read mode, on the other hand, the circuit 6 is deactivated automatically in response to the signal levels on the lines 1, which will be described in detail later. The impedance means 2 is activated in the read mode to connect the data lines $\overline{\text{RWBS}}$ and RWBS to the power source line 7 respectively with a predetermined impedance. The impedance means 3 responds to the read data signals on the lines RO/$\overline{\text{RO}}$ to connect one of the data lines $\overline{\text{RWBS}}$ and RWBS to the power source line 8 with a predetermined impedance, the other data line $\overline{\text{RWBS}}$ or RWBS being disconnected from the ground line 8. Therefore, the high level of the read data signals appearing on the data bus line 1 takes the vcc level, whereas the low level thereof takes an intermediate level between the Vcc and ground levels determined by the impedance of the circuits 2 and 3. Thus, the read data signal has an amplitude smaller than that of the write data signal. Moreover, the impedances of the circuits 2 and 3 are designed such that the low level of the read data signal is close to the Vcc level.

FIG. 2 shows a circuit configuration of the load control circuit 2 which comprises an inverter $\text{INV}_{21}$ and P-channel transistors $Q_{P21}$ and $Q_{P22}$ which are connected as shown. Except a period of a write mode a control signal W1 remains the "Nigh" level and the transistors $Q_{P21}$ and $Q_{P22}$ are thereby in a conductive state having a predetermined value of impedance.

The write amplifier 5 is basically designed as shown in FIG. 3. When the control signal $\overline{\text{W1}}$ is at "High", all the transistors are rendered nonconductive, so that the output nodes $N_{31}$ and $N_{32}$ of the write amplifier 5 remain in high impedance state. When the control signal $\overline{\text{W1}}$ is at "Low" to indicate the write mode, the write amplifier 5 drives the data bus line pair 1 to output thereon true and complementary signals in accordance with write data $\overline{\text{WD}}$.

Figure 5:
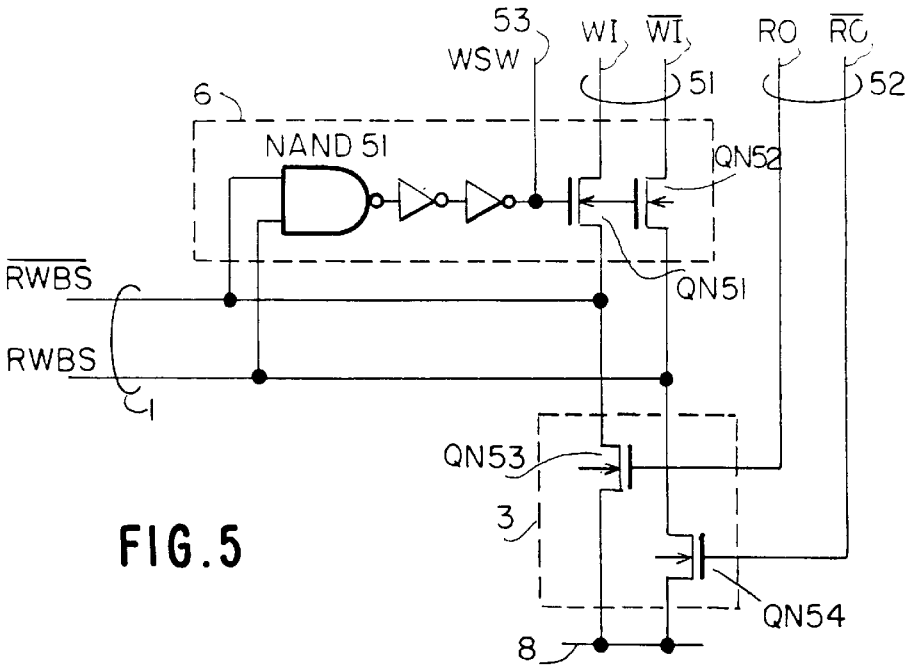
FIG. 5 shows a circuit of the write control gate and the impedance means.

The load control circuit 2 can be incorporated into the write amplifier 5, as shown in FIG. 4. When the control signal $\overline{\text{W1}}$ is at "High", each NOR circuit $\text{NOR}_{41}$, $\text{NOR}_{42}$, $\text{NOR}_{43}$, and $\text{NOR}_{44}$ outputs a low level signal so that P-channel transistors $Q_{P41}$ and $Q_{P42}$ are in a conductive state and N-channel transistors $Q_{N41}$ and $Q_{N42}$ are in a non-conductive state. When the signal $\overline{\text{W1}}$ is at "Low", the circuit of FIG. 4 operates as a read amplifier to drive the data bus line pair 1 in accordance with the write data $\overline{\text{WD}}$ in the same manner as the circuit of FIG. 3. The transistors $Q_{P41}$, $Q_{N41}$, $Q_{P42}$, and $Q_{N42}$ shown in which FIG. 4 and the transistors shown in FIG. 3 have large capability for driving the data bus line 1 so as to transfer the write data signal quickly The circuit configurations Of the write data control gate 6 and the read data control circuit 3 are described in FIG. 5. The write date control gate 6 comprises a NAND gate circuit $\text{NAND}_{51}$ having first and second input nodes connected respectively to the data lines $\overline{\text{RWBS}}$ and RWBS. In the data write mode, one of the data bus lines 1 takes a level substantially equal to the Vcc level, whereas the other thereof takes a level substantially equal to the ground level. Therefore, the gate circuit $NAND_{51}$ produces a high level output during a write mode, so that N-channel transistors $Q_{N51}$ and $Q_{N52}$ are turned ON through two inverters. The data bus line pair 1 is thus coupled to the write-in line pair 51.

The read data control circuit 3 comprises N-channel transistors $Q_{N53}$ and $Q_{N54}$ connected as shown. One of the transistors $Q_{N53}$ and $Q_{N54}$ is turned ON by the associated read signal and the other thereof is held OFF. Note that transistors $Q_{P21}$ and $Q_{P22}$ (FIG. 2) are turned ON during a period except the write mode period. Accordingly, one of the data bus lines 1 takes the level substantially equal to the Vcc level, and the other thereof takes the intermediate level between the Vcc and ground levels determined by the impedances of the transistors $Q_{P21}$ ($Q_{P22}$) and $Q_{N53}$ ($Q_{N54}$). This intermediate level is designed to be higher than the threshold level of the gate circuit $NAND_{51}$. Therefore, the gate $NAND_{51}$ produces a low level output to render the transistors $Q_{N51}$ and $Q_{N52}$ nonconductive during the period except the write mode.

While in this embodiment the write control circuit 6 outputs the true and complementary write data signals to the memory array 9, it is also possible to transfer the write data by using a single signal line with one transfer gate transistor to the memory array 9.

The write control gate 6 further provides the memory array 9 with a control signal WSW via a control line 53 in addition to the write data signal during a write mode.

In a read mode, when the address signal is changed and another read data which has a different logical value from that of the preceding read data is transferred to the circuit 3 from the memory array 9, the potential level of the data bus lane 1 must be inverted. However, owing to the amplitude of read data signal which is smaller than the potential difference between the power source lines 7, 8, the inversion can be performed quickly and with a small current consumption. In detail, the transistors $Q_{N53}$ 3and $Q_{N54}$ have such a small capability or such a large impedance as to drive or discharge the data lines $\overline{RWBS}$ and RWBS to a potential level which is close to the level of the power source line 7. Therefore, for example, when the address signal is changed and transistors $Q_{N53}$ and $Q_{N54}$ become non-conductive and conductive, respectively, in accordance with the latest read data, the transistor $Q_{N54}$ has an impedance which is three or four times large than that of the transistors in the write buffer 5 or the circuit shown in FIG. 4 in order to pull down the potential level of the data line RWBS to the predetermined intermediate level. At the same time, the data line RWBS is driven or charged by the transistor $Q_{P41}$ shown in FIG. 4 which is formed in an input-output buffer region of the device and has a comparatively large size and capability for driving the data line $\overline{RWBS}$. The potential level of the line $\overline{RWBS}$ is, therefore, inverted quickly when the transistor $Q_{N53}$ becomes non-conductive. Consequently, the read mode operation is performed in high speed and with small current consumption, and the impedance means 3 can be formed in a small area to reduce the size of the device.

After the read mode operation, when the control signal $\overline{W1}$ shown in FIG. 4 changes from "High" to "Low" state, which indicates a write mode operation, the write buffer 5 shown in FIG. 4 is activated for driving the data lines $\overline{RWBS}$ and RWBS in accordance with the write data signal $\overline{WD}$ and outputs the write data having an amplitude corresponding to the power source lines 7, 8. As described above, the transistors $Q_{P41}$, $Q_{N41}$, $Q_{P42}$ and $Q_{N42}$ have a large capability for driving data lines $\overline{RWBS}$ and RWBS so that the potential level of data bus line 1 is quickly inverted and/or amplified according to the write data signal even if the transistor $Q_{N53}$ or $Q_{N54}$ is in a conductive state. Therefore, in this memory device which embodies the invention, the data collision .between the newly input write data and the read data of the preceding read mode on the data bus line is eliminated so that operation errors are prevented- Moreover, the impedance means 3 does not require any control signals indicating the operation mode of the device for disconnecting the memory array 9 from the data bus line 1 when a write mode operation begins. Needless to say, the memory device of this embodiment does not require other gate circuits for disconnecting the memory array 9 from the data bus line 1. As a consequence, the memory device does not need any control signal lines which transfer information about the operation mode of the device to an inner circuit region which Comprises the memory array 9, write control gate 6 and impedance means 3 other than the data bus line 1.

Therefore, the circuit configuration or the layout of the device is simplified and the area of the device is decreased.

Furthermore, as a preferable circuit design of the device, the "High" and/or "Low" level of the data lines $\overline{RWBS}$, RWBS is common to the write and the read data which have the same logical value. For example, when a write data having a logical value "1" is transferred via the data bus line 1, the line RWBS becomes "High" level, and when a read data having a logical value "1" is transferred, the line RWBS becomes also "High" level. According to this configuration, even if data being held in a certain memory cell of the memory array 9 which is selected according to the address data is continuously transferred to the impedance means 3 regardless of whether it is in a read or write mode, the potential level of write data is never changed by the transistors $Q_{N53}$, $Q_{N54}$ of the impedance means 2 and write mode operations are safely performed. Moreover, in this configuration of the device, currents through the transistors $Q_{N53}$, $Q_{N54}$ does not flow stably during the write mode except for when address data to the memory array 9 are changed so that the current consumption is small.

Figure 6:
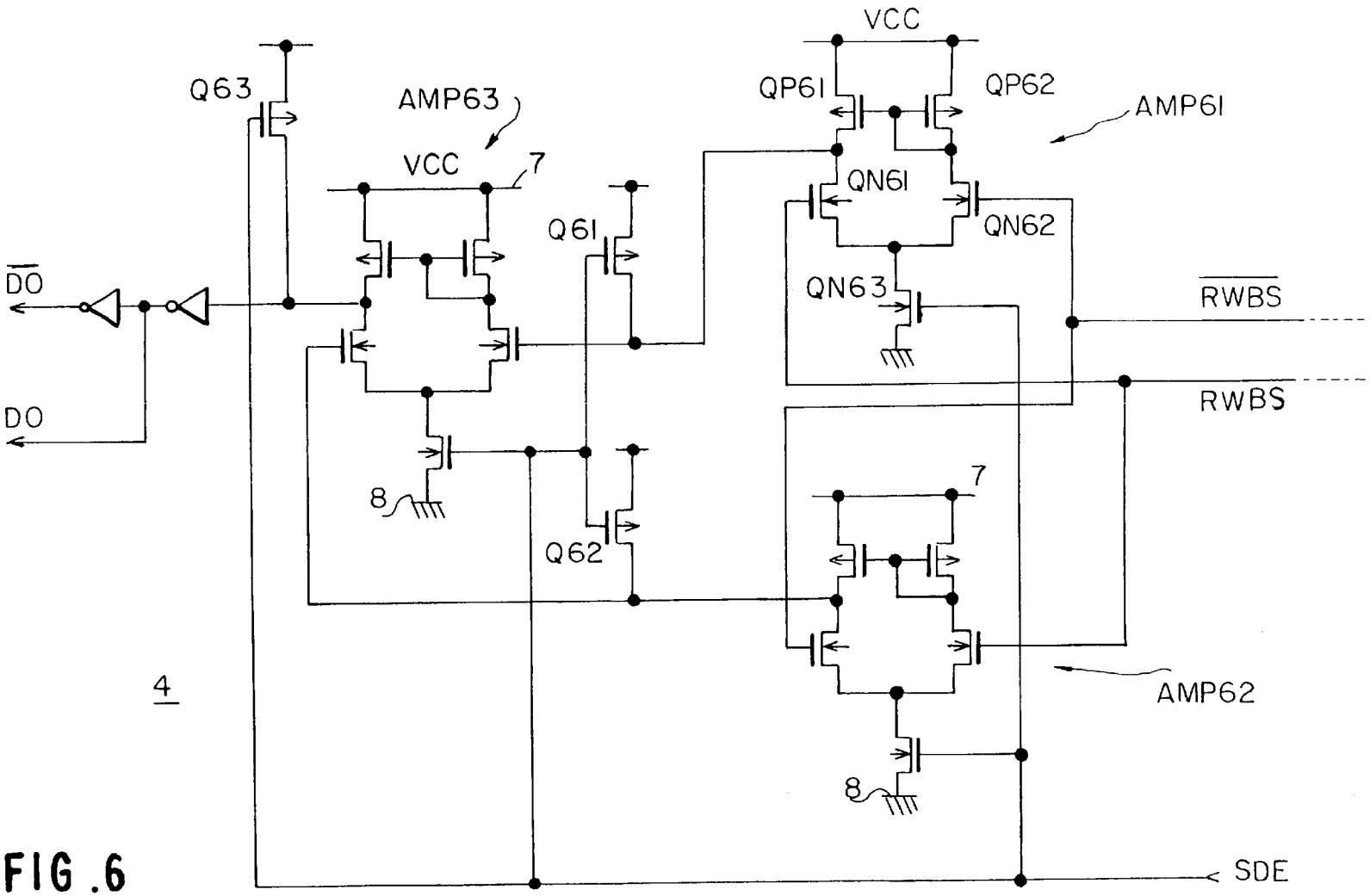
FIG. 6 is a circuit configuration Of the read amplifier.

FIG. 6 shows a circuit of the read amplifier 4, while the potential difference between the lines $\overline{RWBS}$, RWBS in the read mode is comparatively small as described above, the read amplifier 4 comprises three stages of amplifiers $AMP_{61}$, $AMP_{62}$ and $AMP_{63}$. Each of the amplifiers $AMP_{61}$, $AMP_{62}$ amplifies the potential difference between the lines $\overline{RWBS}$, RWBS independently, and the amplifier $AMP_{63}$ amplifies the potential difference between the two output signals of the amplifiers $AMP_{61}$, $AMP_{62}$ while the activation control signal SDE is at "High" and the data lines $\overline{RWBS}$ and RWBS supply the potential difference as read data.

Figure 7:
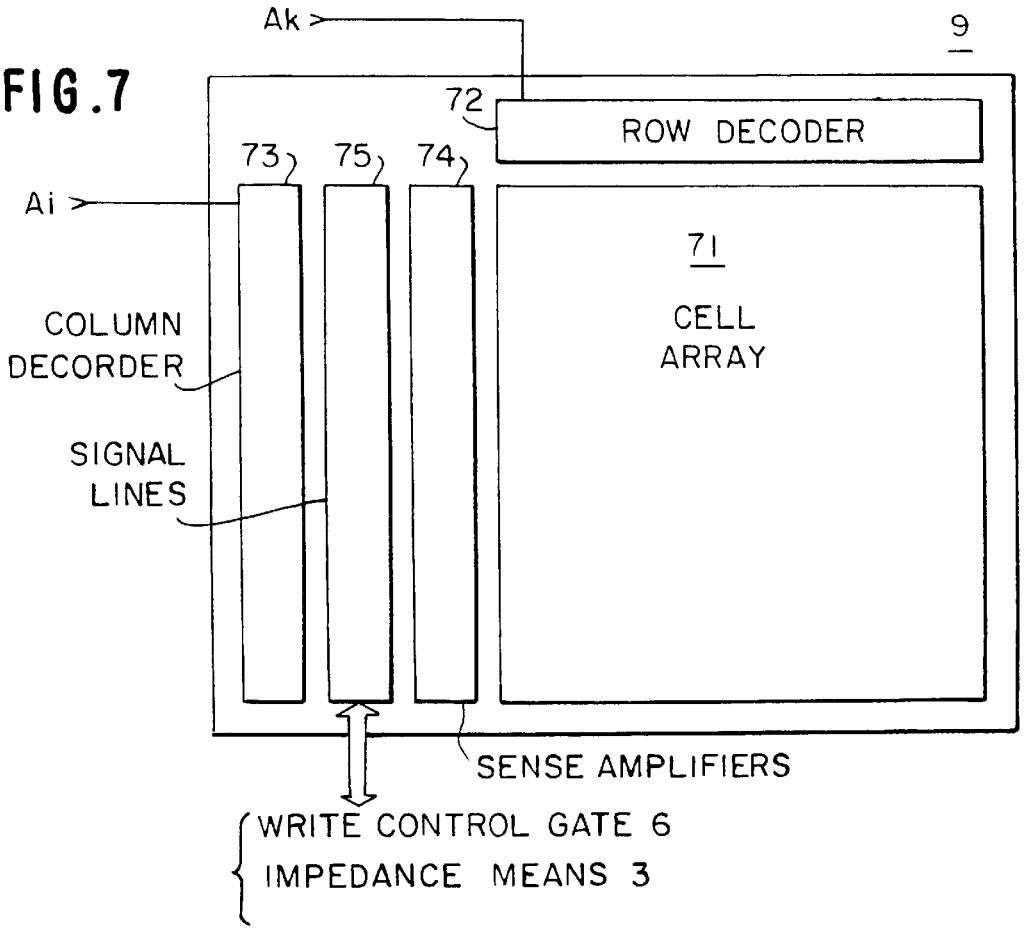
FIG. 7 is a block diagram of the memory array.
Figure 8:
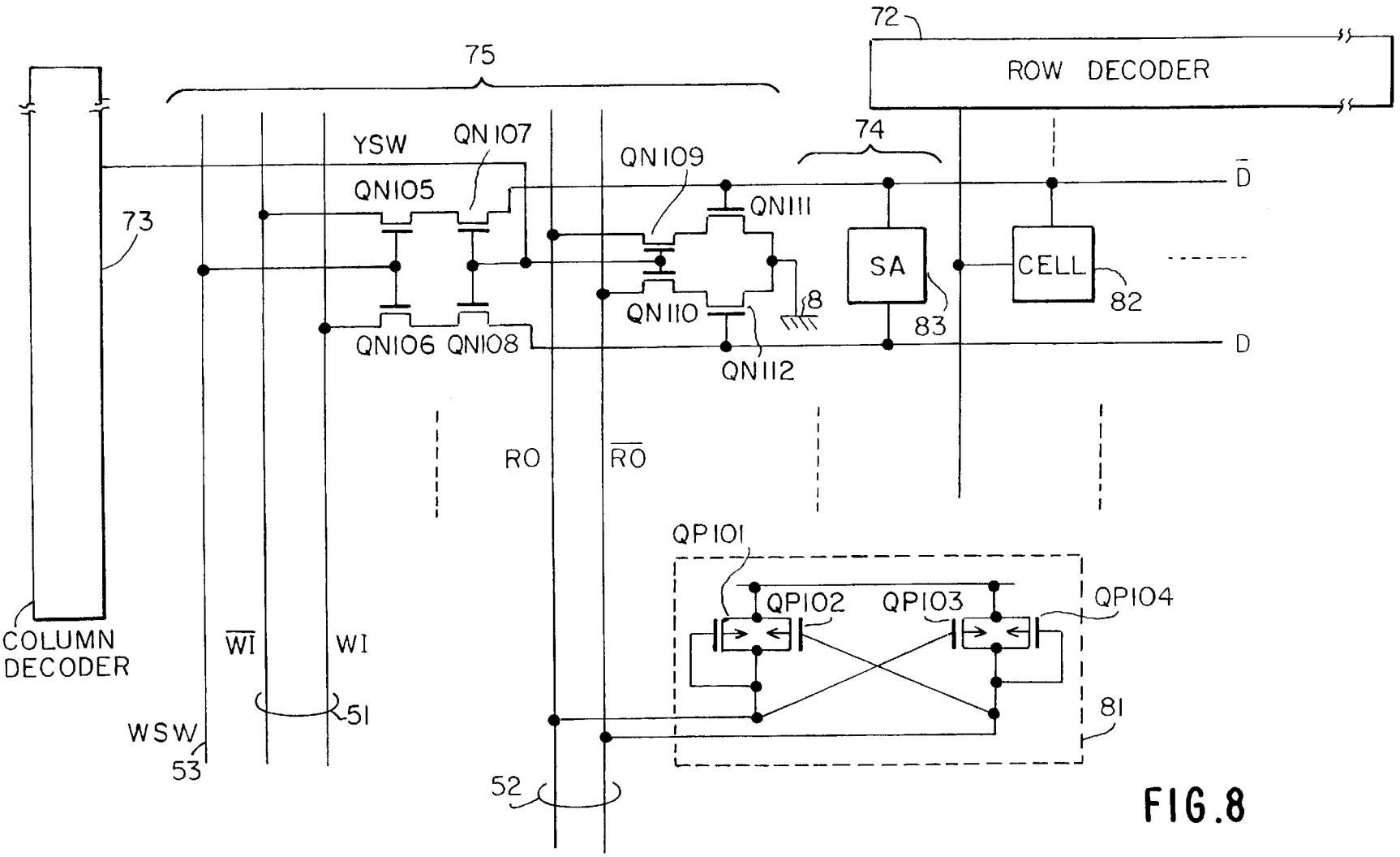
FIG. 8 is a more detailed configuration of the memory array.

Referring to FIGS. 7 and 8, the configuration of the memory array 9 will now be described. The memory array 9 comprises a cell array 71, a row decoder 72, a column decoder 73; an amplifier region 74 and a signal line region 75 equipped with the signal lines 51, 52, 53 shown in FIGS. 7 and 8. In the cell array 71, the memory cells 82 are arranged in rows and columns. FIG. 8 shows a circuit configuration corresponding to one of the columns. Each memory cell 82 is associated with a bit line pair $\overline{D}$/D and a word line WL connected to the row decoder 72. The bit line pair $\overline{D}$/D is selectively connected to the wirte-in bus line 51 including data lines $\overline{WL}$, WL via column selection gate transistors $Q_{N107}$, $Q_{N108}$ and write switch gate transistors $Q_{N105}$, $Q_{N106}$ according to a column selection signal YSW from the column selector 73 and a write switching control signal WSW from the control signal line 53. The bit lines $\overline{D}$, D are also connected to the gate electrodes of the transistors $Q_{N111}$, $Q_{N112}$. One end of the source-drain path of each transistor $Q_{N111}$, $Q_{N112}$ is connected to the ground line 8 and the other end is connected to the read-out bus line 52 including data lines $\overline{RO}$, RO via column selection gate transistors $Q_{N109}$, $Q_{N110}$ according to the column selection signal YSW. The potential levels of the data signal on the bit lines $\overline{D}$, D are therefore output to the lines $\overline{RO}$, RO, respectively, with a reversed potential level. In this embodiment, the bit lines $\overline{D}$and D correspond to the gate transistors $Q_{N51}$ and $Q_{N52}$ and to the transistors $Q_{N53}$ and $Q_{N54}$ shown in FIG. 5, respectively, in order to harmonize the potential level of the data bus line 1 corresponding to a certain logical value of the write data with that of the read data, which has the same logical value as the write data, as mentioned above.

The read bus line 52 is equipped with an active load circuit 81. This circuit 81 cooperates with the transistors $Q_{N109}$—$Q_{N112}$ to transfer the potential difference between the bit lines D/$\overline{D}$ to read-out lines 52. The transistors $Q_{P101}$, $Q_{P104}$ in the data amplifier 81 work as clamp transistors and restrict the amplitude of read signals transferred on the bus line 52 so that the potential level of the bus line 52 can be inverted quickly when the data signal is changed and the operation speed in the read mode becomes high.

Figure 9:
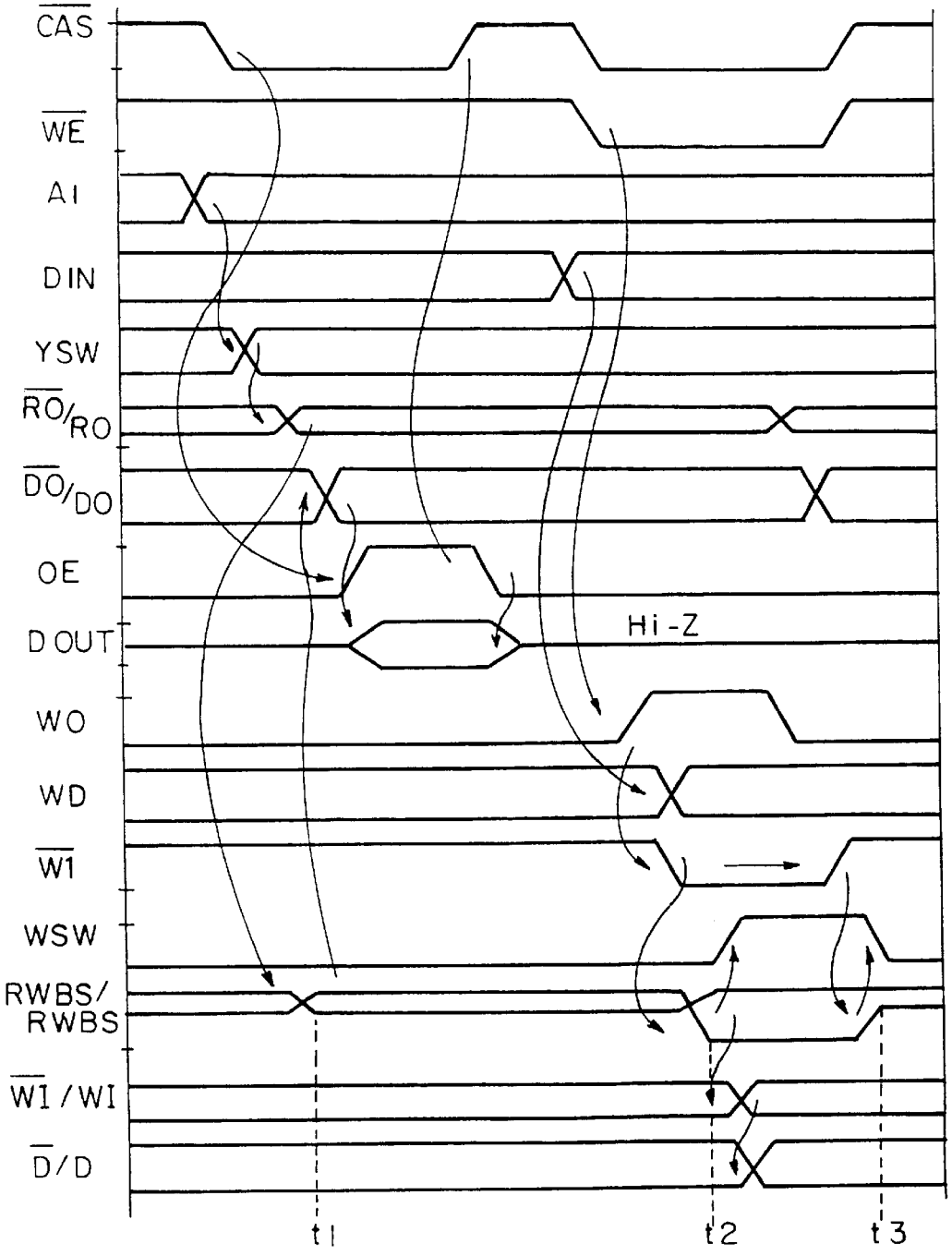
FIG. 9 is a timing chart showing an operation of the device.

Next, the operation of the device of this embodiment will be described sequentially. FIG. 9 is a timing chart of the operation. The description will begin with the condition that the row address strobe signal $\overline{RAS}$ (not shown) has gone from "High" to "Low" level state to select one of the word lines WL and rise the potential level of it, the memory cell 82 being thereby connected to the corresponding one of bit line pair $\overline{D}$/D to produce the potential difference between the bit lines $\overline{D}$, D in accordance with the data stored in the memory cell 82.

First the read mode operation will be described. In this operation, the write-enable signal $\overline{WE}$ remains at the high level state even when the column address strobe signal $\overline{CAS}$ (not shown) changes to the active low level. The write control circuit WC shown in FIG. 1 thereby keeps the control signal $\overline{WI}$ at the high level. Therefore, the transistors $Q_{P21}$ and $Q_{P22}$ in the circuit 2 are rendered conductive, whereas the write buffer 5 keeps its output nodes in a high impedance state. In the circuit shown in FIG. 4, on the other hand, the transistors $Q_{P41}$, $Q_{P42}$ are in a conductive state and the transistors $Q_{N41}$, $Q_{N42}$ are in a non-conductive state. Assuming that the column address signal Ai designates the column selection signal YSW, the transistors $Q_{N107}$ to $Q_{Nl10}$ are rendered conductive. The true and complementary read data signals on the bit line pair $\overline{D}$/D are transferred via the transistors $Q_{N109}$, $Q_{N110}$ to the read bus lines $\overline{RO}$/RO in a manner as mentioned above. One of the transistors $Q_{N53}$ and $Q_{N54}$ is thereby turned 0N and the other thereof is turned OFF. The true and complementary signals indicative of the read data are thus transferred to the data bus lines 1 at the time of t1 as shown in FIG. 9. Subsequently, the signal on the bus line 1 is amplified by the read amplifier 4 and output as the data signal $\overline{DO}$/DO to the output buffer OB. Meanwhile, according to the transition of the signal $\overline{CAS}$, the output buffers supplied with the output-enable control signal OE in its high level state and output the read data as an output data $D_{out}$ in accordance with the signal $\overline{DO}$/DO. when the signal $\overline{CAS}$ is turned to the high level, the control signal OE is changed to the low level and the output buffer OB maintains its output node in high impedance state. In this operation, the potential difference appearing at the data bus line 1 is so small that the gate circuit $NAND_{51}$ in the write gate circuit does not detect the difference and that the output signal of the gate circuit $NAND_{51}$ or the control signal WSW remains in low level. Therefore, the write-in bus line 51 is disconnected from the signal lines which transfer the read data bus 1, by the transistors $Q_{N53}$, $Q_{N54}$, $Q_{N105}$, $Q_{N106}$ and the parasitic capacitances to the signal lines are decreased to achieve the read mode operation in high speed.

The write mode operation will be described below. According to FIG. 9, the write mode operation begins with no transition of address data only to simplify the description. If the address data is changed preceding to the write mode, the row decoder 72 and column decoder 73 select another memory cell 82 by using the word line WL and column selection signal YSW. When the external input signals $\overline{WE}$ and $\overline{CAS}$ become low level, the write control circuit WC (FIG. 1) outputs an active level control signal WO to an input buffer IB shown in FIG. 1 to activate it for latching the input data signal $D_{in}$. The input buffer IB thereby outputs the write data signal $\overline{WD}$ to the write buffer 5. Subsequently, the write control circuit WC changes the control signal $\overline{WI}$ to the low level to deactivate the circuit 2. The write amplifier 5 thereby drives the data bus lines 1 in response to the write data WD. In the circuit as shown in FIG. 4, on the other hand, the transistors $Q_{P41}$, $Q_{P42}$, $Q_{N41}$, $Q_{N42}$ operates to drive the data bus lines 1. The difference between the true and complementary signals indicative of the write data thereby have a large amplitude extending to the levels of the power source lines 7 and 8 at the time t2 as shown in FIG. 9. The gate circuit $NAND_{51}$ in the write control gate 6 detects the potential difference thus large between the data line $\overline{RWBS}$ and RWBS and outputs a high level signal to the transistors $Q_{N51}$, $Q_{N52}$ and a high level control signal WSW to the transistors $Q_{N105}$ and $Q_{N106}$ so as to connect the write-in bug lines 51 to the data bus lines 1. The write data signals are thereby transferred to the bit line pair $\overline{D}$/D via the column selection transistors $Q_{N107}$, $Q_{N108}$ and the gate transistors $Q_{N105}$, $Q_{N106}$. The write data signals thus, transferred are amplified by the sense amplifier 83 and then written in the memory cell 82. Meanwhile, the read-out bus line 52 transfers the write data signal appearing at the bit line pair $\overline{D}$/D to the circuit 3. However, as described above, the conductive and/or non-conductive states of the transistors $Q_{N53}$, $Q_{N54}$ are corresponding to the potential levels of the data lines $\overline{RWBS}$, RWBS so as to eliminate penetrating currents through the transistors $Q_{N53}$, $Q_{N54}$ to the power source line 8 during the write mode. If the transistors $Q_{N53}$, $Q_{N54}$ do not correspond to the levels of the lines $\overline{RWBS}$, RWBS in such a manner, although the current consumption of the device increases, the write mode operation can be safely achieved. Because the impedance of the transistors $Q_{N53}$, $Q_{N54}$ is so high that the potential level of the data line $\overline{RWBS}$ of RWBS which is in a high level state is decreased to the intermediate potential level which is only a somewhat lower than the level of the power source line 7. Therefore, the potential difference between the intermediate level and the level of the power source line 8 is sufficiently large to transfer the write data is correctly transferred via the data bus line 1.

The control signal $\overline{WI}$ is a one-shot signal which is in a low level state in a short period during the write mode and becomes in a high level state when or Just before the write data is certainly transferred to a memory cell 82. Subsequently, the write buffer 5 turns its output nodes in high impedance states and the impedance means 2 supply the potential level of the power source line 7 to the lines $\overline{RWBS}$, RWBS, or, according to FIG. 4, the transistors $Q_{p42}$, $Q_{P42}$ become conductive and the transistors $Q_{N51}$, $Q_{N42}$ become non-conductive. The potential levels of the lines $\overline{RWBS}$, RWBS become the high level of the power source line 7 or the intermediate level corresponding to the write data at the time t3 as shown in FIG. 9. Then, the gate circuit $NAND_{51}$ stops to output a high level signal and the transistors $Q_{N51}$, $Q_{N52}$, $Q_{N105}$, $Q_{N106}$ become non-conductive so as to disconnect the write-in bus line 51 from the data bus line 1 and the bit line pair $\overline{D}$/D.

Figure 10:
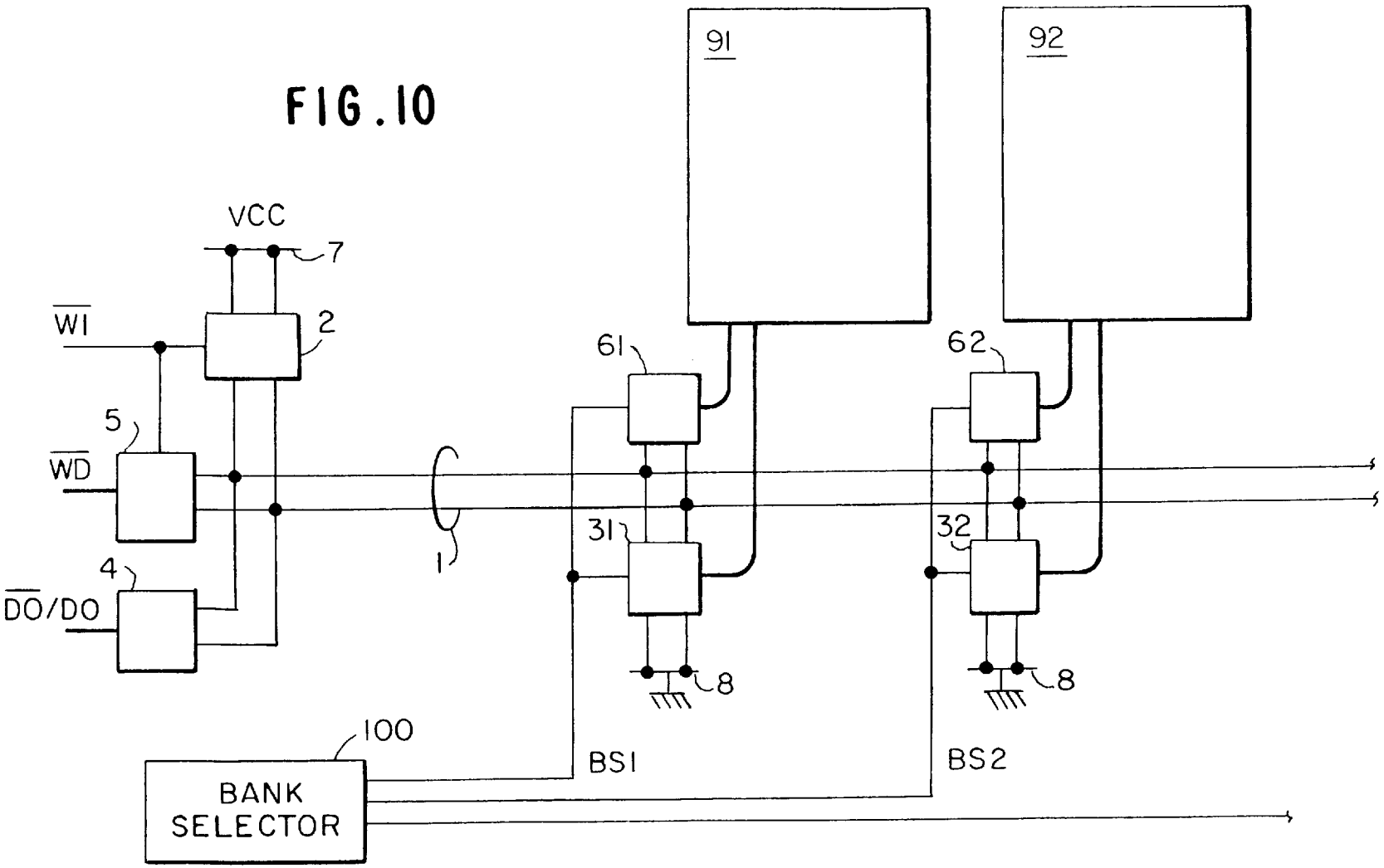
FIG. 10 shows a block diagram of the memory device of a second embodiment.
Figure 11:
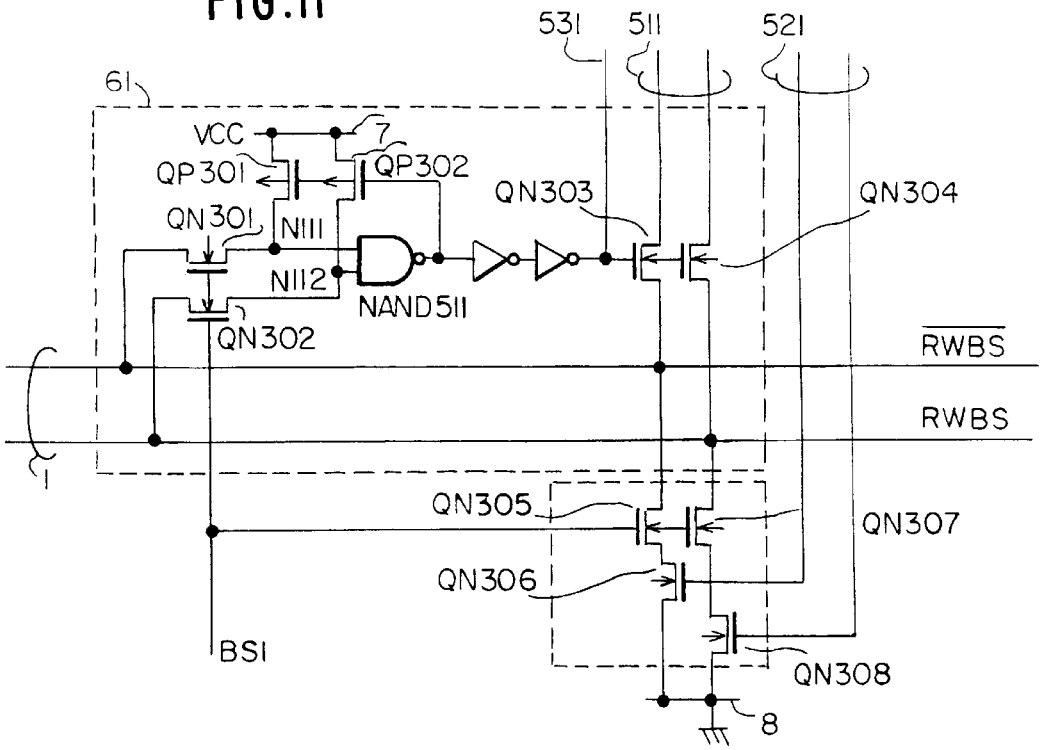
FIG. 11 shows a circuit of the write control gate and the impedance means.

FIG. 10 shows a block diagram of the memory device according to the second embodiment of the invention. The memory device is equipped with a plurality of memory arrays 91, 92. Only two of the memory arrays 91, 92 are shown in FIG. 10 to simplify the description- Each memory array 91, 92 has the same configuration as that of the first embodiment. The device is also equipped with a bank selector 100 for outputting bank selection Signals BS1, BS2. The circuit configurations or functions of the data bus line 1, the impedance means 2, the write buffer 5 and the read amplifier 4 is also the same as those of the first embodiment. FIG. 11 shows a write control gate 61 and an impedance means 31 each associated with the memory array 91. The bank selection signal which is output from the bank selector 100 becomes high level when the memory array 91 is selected according to an address data signal. In this state, in a read mode, the transistors $Q_{N305}$, $Q_{N307}$ are in conductive states and either of the transistors $Q_{N306}$, $Q_{N308}$ becomes conductive in accordance with a read data. The data lines $\overline{RWBS}$, RWBS have the potential level of the power source line 7 or an intermediate .potential level which is determined by the ratio of impedances of the impedance means 2 and 31. The impedance of the impedance means 31 is determined by the transistors $Q_{N305}$ and $Q_{N306}$, or the transistors $Q_{N307}$ and $_{N308}$, In this embodiment, it is desirable for the impedance means 31 to have a large impedance, so that the area occupied by the impedance means 8 can be small and nearly the same as that of the first embodiment. Meanwhile, the transistors $Q_{N301}$, $Q_{N302}$ are provided with the high level signal BS1 at the gate electrodes. However, because of the potential levels of the lines $\overline{RWBS}$, RWBS both of which are close to the level of the power source line 7, the transistors $Q_{N301}$, $Q_{N302}$ are in non-conductive states and the read data are transferred without any obstruction by the potential level of the nodes $N_{111}$, $N_{112}$. Preferably the transistors $Q_{N301}$, $Q_{N302}$ comprise comparatively high threshold voltages. During a read mode, the nodes $N_{111}$, $N_{112}$ are maintained in high level by the transistors $Q_{P301}$, $Q_{P302}$ so that the gate circuit $NAND_{511}$ outputs a low level signal indicating a read mode.

In a write mode, the lines $\overline{RWBS}$, RWBS have the high or low potential level of the power source line 7 or 8 according to the write data so that either of the transistors $Q_{N301}$, $Q_{N302}$ which corresponds to one of the lines $\overline{RWBS}$, RWBS having the low potential level turns into the conductive state. Therefore, the gate circuit $NAND_{511}$ outputs a high level signal to indicate a write mode operation. The transistors $Q_{P301}$, $Q_{P302}$ turn into nonconductive state so that the write data are correctly transferred. In this case, at the beginning of the write mode, owing to the transistors $Q_{P301}$, $Q_{P302}$ being in conductive states, a penetrating current flows to one of the lines $\overline{RWBS}$, RWBS which is at a low level. However, it is sufficient for the transistors $Q_{P301}$, $Q_{P302}$ to have a small driving capability for maintaining the nodes $N_{111}$, $N_{112}$. Therefore, the current is so small that the write mode operation is safely performed.

Figure 13:
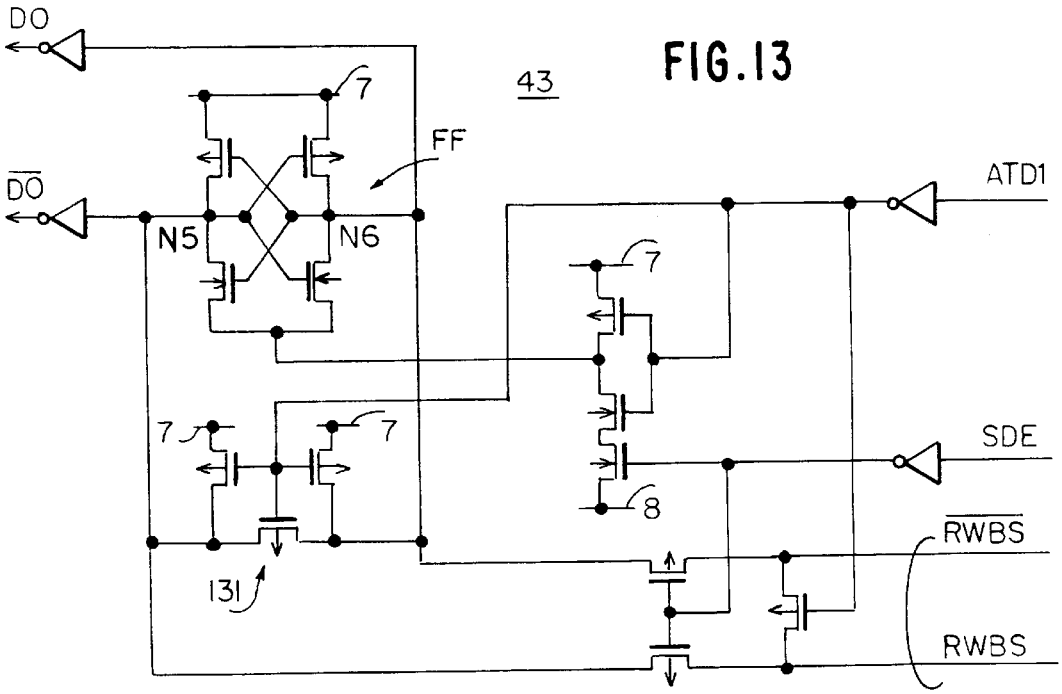
FIG. 13 shows the amplifier circuit according to the third embodiment.
Figure 15:
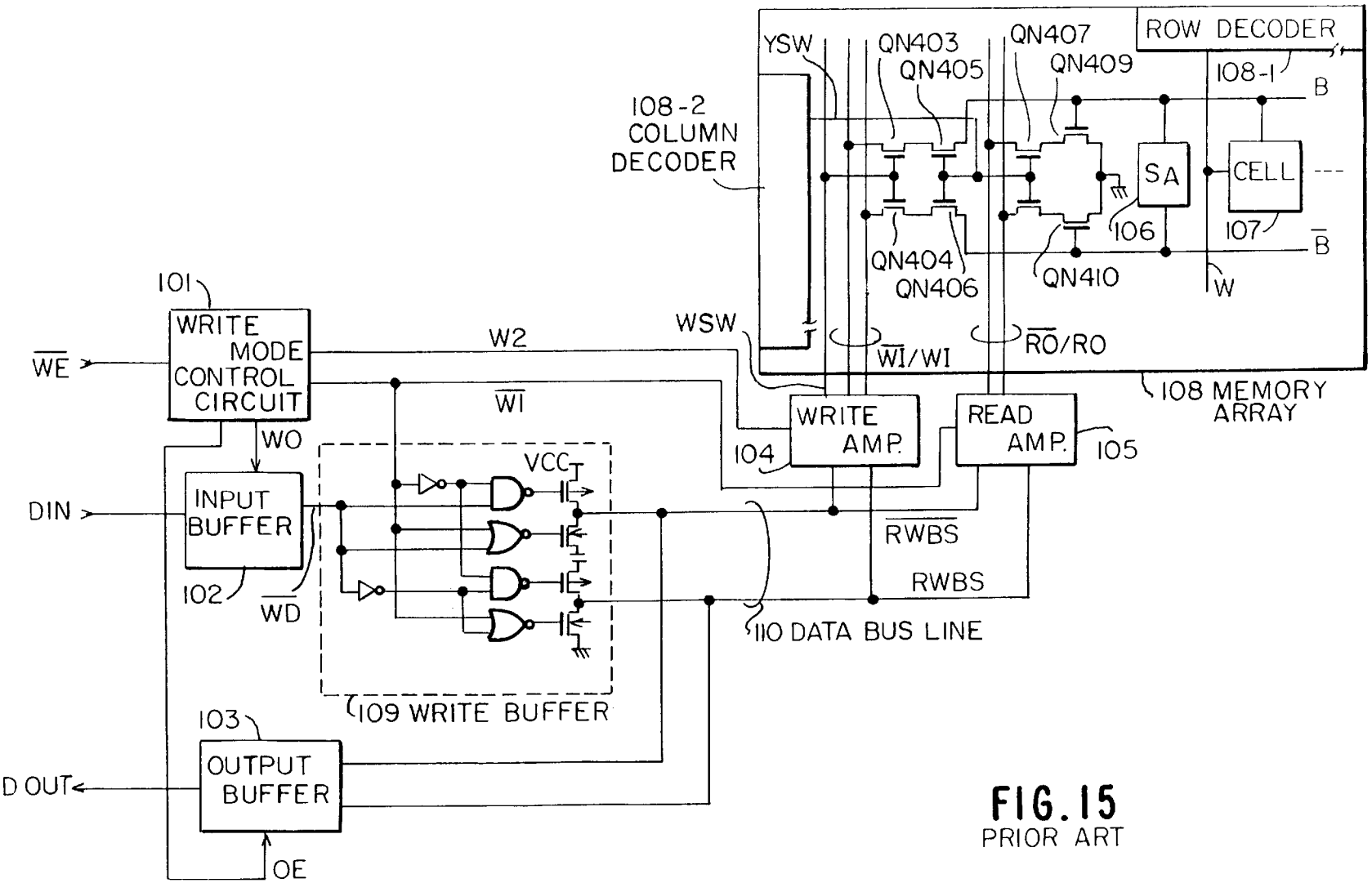
FIG. 15 PRIOR ART
FIG. 15 is a circuit diagram of a memory device having mode control signal lines.
Figure 16:
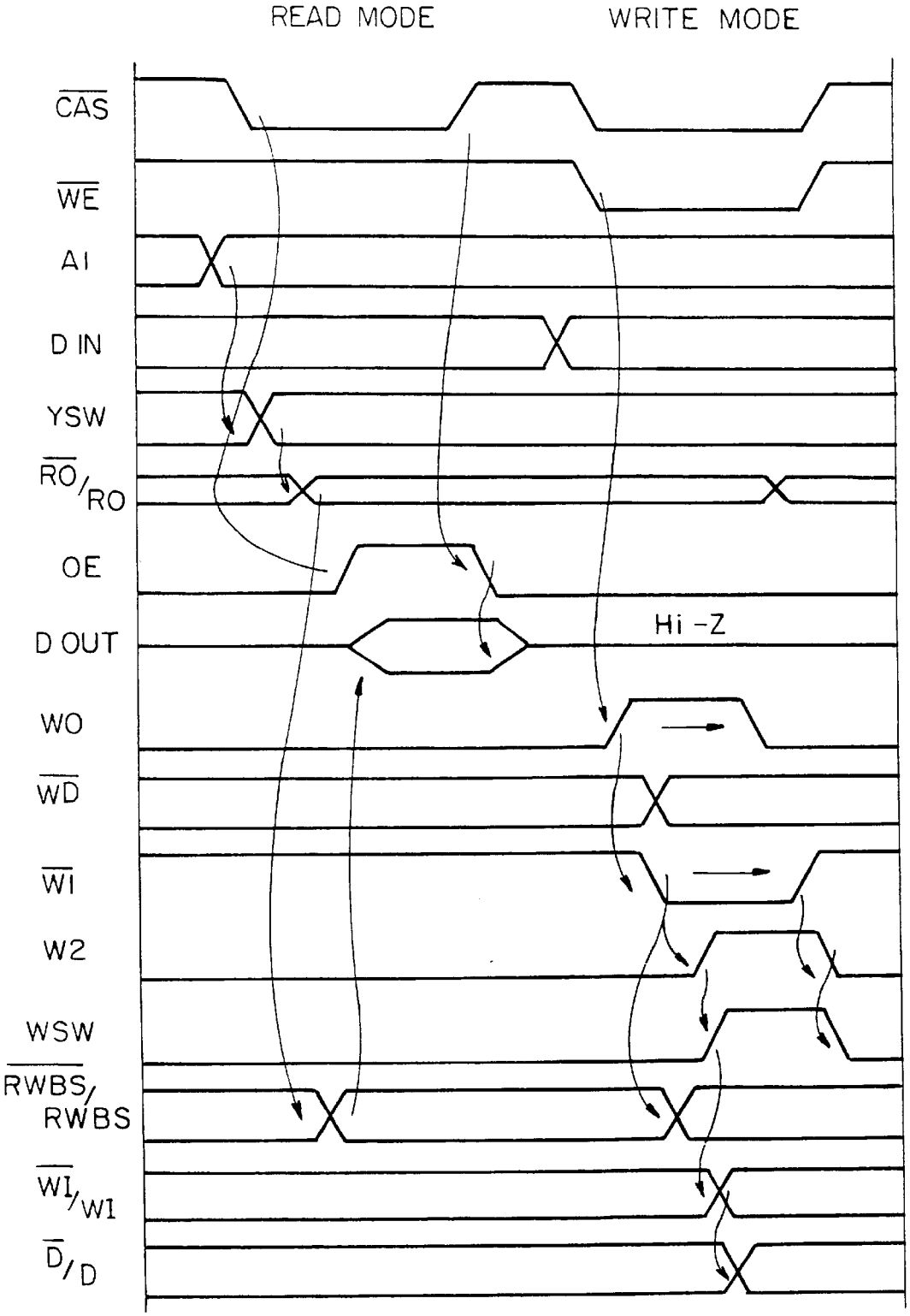
FIG. 16 PRIOR ART
FIG. 16 is a timing chart of the device shown in FIG. 15.

Now the third embodiment of the invention will be described. The memory device of this embodiment is equipped with an impedance means 33 as shown in FIG. 12 and a read amplifier 43 as shown in FIG. 13. Other elements are almost the same as in the first or second embodiment. The impedance means 33 has nearly the same configuration as that of the second embodiment other than the gate electrode input signal to the transistors $Q_{N123}$, $Q_{N124}$ which is an address transition pulse signal ATD2. The impedance means 33, therefore, works in the same manner as that of the first embodiment, i.e. only when the address data is changed. Consequently, the current which flows from the power source line 7 to the power source line 8 through the impedance means 2 and 33 during read mode is extremely decreased. The read amplifier 43 also works as an amplifier only when the address data is changed and latches the read data signal to continuously output the output data signal $\overline{DO}$/DO.

FIG. 14 is a timing chart of the read mode operation of this device. Initially the data line $\overline{RWBS}$, RWBS is maintained at the high level by the impedance means 2. When the address signal ADD is changed, the control pulse signal ATD1 turns to its high level so that the read amplifier 43 is deactivated and the output signals $\overline{DO}$, DO are connected to each other and turn to the high level due to the balancing circuit 131. After that, the control pulse signal SDE with the high level is supplied to the amplifier 43 to connect the data lines $\overline{RWBS}$, RWBS to the flip-flop portion FF of the amplifier 43. Subsequently, the signal ATD1 turns to low level and the lines RWBS, RWBS is disconnected from each other. Meanwhile, the control signal ATD2 is supplied to the impedance means 33 and the read data signal is transferred via the data bus line 1. The read data signal is applied to the input/output nodes $N_5$, $N_6$ of the flip-flop portion FF. Therefore, when the signal SDE turns to the low level, the flip-flop portion FF amplifies the data signal and latches it independently from the lines $\overline{RWBS}$, RWBS after those are disconnected from the flip-flop portion FF. After the read data is transferred to the flip-flop portion FF, the signal ATD2 turns to low level in order to eliminate current consumption. The write mode operation of this device can be achieved in the same manner as in the case of the first or second embodiment.

In above-mentioned embodiments, the memory device can perform the read operation in high speed with small current consumption because of the small amplitude of the read data signal and the short period of transferring it. Furthermore, the device does not need any signal lines for indicating operation mode, that is, read or write, therefore occupies small area only.

The above description explains the invention wherein the higher amplitude preferably indicates the write mode operation. The invention, however, is also applicable if the higher amplitude indicates the read mode operation.

What is claimed is:

1. A semiconductor memory device comprising:

a first memory array;

a first and a second data bus line;

a first circuit means activated at least during a data read mode for connecting said first and second data *bus* line to a first power source line with a first impedance;

a second circuit means responsive to data read out of said memory array for connecting one of said first and second data *bus* lines to a second power source line with a second impedance, said one of said first and second data *bus* lines thereby taking an intermediate level between levels of said first and second power source lines;

a data write means responsive to write data for supplying said first and second data bus lines with true and complementary signals indicative of said write data, a difference in level between said true and complementary signals being close to a difference in level between said first and second power lines; and a read amplifier coupled to said first and second data *bus* lines for amplifying a potential difference therebetween during said data read mode.

2. The semiconductor memory device as claimed in claim 1, wherein said first and second potential levels are a positive voltage level and a ground level, respectively.

3. The semiconductor memory device as claimed in claim 2, further comprising a write control gate circuit coupled between said memory array and said first and second data *bus* lines, said write control gate circuit including a logical gate circuit having an input threshold voltage lower than said intermediate level.

4. The semiconductor memory device as claimed in claim 1, wherein said first circuit means include a first and a second transistor each connected between said first power source line and an associated one of said first and second data *bus* lines, said second circuit means include a third and a fourth transistor each connected between said second power source line and an associated one of said first and second data *bus* lines, and said intermediate level is determined by a ratio of impedance values between said first and said third transistors or said second and fourth transistors.

5. The semiconductor memory device as claimed in claim 4, wherein said data write means cooperates with said first and second transistors to supply said first and second data bus lines with said true and complementary signals indicative of said write data during a data write mode, and said first and second transistors are rendered conductive irrespective of said write data during said data read mode.

6. The semiconductor memory device as claimed in claim 1, further comprising a controller for outputting a first control signal to said second circuit means for a first time period in response to an input of an address data for said memory array, said second circuit means being activated by said first control signal to connect said first and second data bus lines to said second power source line in accordance with said read data during said first time period.

7. The semiconductor memory device as claimed in claim 6, wherein said controller further outputs a second control signal to said read amplifier in response to said input of said address data and in said first time period, said read amplifier being activated by said second control signal to amplify and hold said read data appearing on said first and second data bus lines.

8. The semiconductor memory device as claimed in claim 1, wherein said memory array is divided into a first and a second memory array portions and said second circuit means is divided into a first and a second partial circuits which are provided correspondingly to said first and second memory array portions, and a control circuit for outputting a first control signal to activate said first partial circuit and a second control signal to activate said second partial circuit.

9. The semiconductor memory device as claimed in claim 8, wherein said control circuit outputs each of said first and second control signals as a pulse signal in response to a transition of said address data.

10. The semiconductor memory device as claimed in claim 1, further comprising an activation control circuit for supplying an activation signal to said second circuit means according to an address data for said memory array, said second circuit means thereby being activated to connect said first and second data bus lines to said second power source line in accordance with said read data.

11. A semiconductor memory device comprising:

a memory array;

a data bus line;

a read driver coupled between said memory array and said data bus line for driving, in response to read data from said memory array, said data bus line such that said data bus line takes a first voltage level when said read data is a first logic level and a second voltage level when said read data is a second logic level, said first voltage level being different from said second voltage level;

a write driver coupled to said data bus line for driving in response to write data to be supplied to said memory array, said data bus line such that said data bus line takes a third voltage level when said write data is one of said first and second logic levels and a fourth voltage level when said write data is the other of said first and second logic levels, said third voltage level being higher than each of said first and second voltage levels and said fourth voltage level being lower than each of said first and second voltage levels;

a write gate coupled between said memory array and said data bus line for transferring said write data to said memory array.

12. A semiconductor memory device comprising:

a memory bank, a data bus line associated with said memory bank for transferring read and write data, said data bus line being equipped with a read circuit block and a write circuit block, said read circuit block driving said data bus line according to said read data from said memory bank to transport a read data signal, said read data signal taking a first voltage level when said read data is a first logic level and a second voltage level when said read data is a second logic level, said first voltage level being different from said second voltage level, and said write circuit block driving said data bus line according to said write data to be supplied to said memory bank to transport a write data signal, said write data signal taking a third voltage level when said write data is one of said first and second logic levels and a fourth voltage level when said write data is the other of said first and second logic levels, said third voltage level being higher than each of said first and second voltage levels and said fourth voltage level being lower than each of said first and second voltage levels.

*13. A semiconductor memory device comprising:*

*a first memory array;*

*a first and a second data bus line;*

*a first circuit means activated at least during a data read mode for connecting said first and second data bus line to a first power source line with a first impedance; and*

*a second circuit means responsive to data read out of said memory array for connecting one of said first and second data bus lines to a second power source line with a second impedance, said one of said first and second data bus lines thereby taking an intermediate level between levels of said first and second power source lines.*

*14. A semiconductor memory device as claimed in claim 13, further comprising a read amplifier coupled to said first and second data bus lines for amplifying a potential difference therebetween during said data read mode.*

*15. A semiconductor memory device as claimed in claim 14, further comprising a data write means responsive to*

*write data for supplying said first and second data bus lines with true and complementary signals indicative of said write data.*

*16. A semiconductor memory device as claimed in claim 13, further comprising a data write means responsive to write data for supplying said first and second data bus lines with true and complementary signals indicative of said write data.*

*17. A semiconductor memory device as claimed in claim 16, wherein a difference in level between said true and complementary signals being close to a difference in level between said first and second power lines.*

*18. A semiconductor memory device as claimed in claim 13, wherein said first circuit means includes a first transistor and a second transistor, each connected between said first power source line and an associated one of said first and second data bus lines, said second circuit means includes a third transistor and a fourth transistor each connected between said second power source line and an associated one of said first and second data bus lines.*

*19. A semiconductor memory device as claimed in claim 18, wherein said first transistor and said second transistor are P-channel transistors.*

*20. A semiconductor memory device as claimed in claim 18, wherein said third transistor and said fourth transistor are N-channel transistors.*

*21. A semiconductor memory device as claimed in claim 20, wherein said intermediate level is determined by a ratio of impedance values between said first transistor and said third transistor or said second transistor and said fourth transistor.*

*22. A semiconductor memory device as claimed in claim 18, wherein said third transistor and said fourth transistor have small size and large impedance so as to drive or discharge said first and second data bus lines to a potential level which is close to the level of said first power source line.*

*23. A semiconductor memory device as claimed in claim 22, wherein said first transistor and said second transistor have a large size relative to the size of said third transistor and said fourth transistor, so as to perform a read operation at high speed with small current consumption.*

* * * * *